United States Patent
Xu (10) Patent No.: US 9,084,362 B2
(45) Date of Patent: Jul. 14, 2015

(54) REDUCING IMPEDANCE OF A PRINTED CIRCUIT BOARD THROUGH A SQUARE WAVE PATTERN OF PLATED-THROUGH HOLES

(71) Applicant: NVIDIA Corporation, Santa Clara, CA (US)

(72) Inventor: Shuang Xu, Guangdong (CN)

(73) Assignee: NVIDIA Corporation, Santa Clara, CA (US)

( * ) Notice: Subject to any disclaimer, the term of this patent is extended or adjusted under 35 U.S.C. 154(b) by 368 days.

(21) Appl. No.: 13/736,086

(22) Filed: Jan. 8, 2013

(65) Prior Publication Data

US 2014/0192502 A1 Jul. 10, 2014

(51) Int. Cl.
*H05K 3/00* (2006.01)
*H05K 1/14* (2006.01)
*H05K 3/36* (2006.01)
*H05K 3/42* (2006.01)

(52) U.S. Cl.
CPC *H05K 1/142* (2013.01); *H05K 3/36* (2013.01); *H05K 3/42* (2013.01); *H05K 2201/09145* (2013.01); *H05K 2201/09618* (2013.01); *H05K 2201/209* (2013.01); *H05K 2203/044* (2013.01); *Y10T 29/49126* (2015.01)

(58) Field of Classification Search
CPC .............................. H05K 1/142; H05K 3/0097
USPC ........... 361/792, 784, 790; 147/255, 261, 354
See application file for complete search history.

(56) References Cited

U.S. PATENT DOCUMENTS

| | | | |
|---|---|---|---|
| 6,605,876 B2 | 8/2003 | Chang et al. | |
| 6,608,377 B2 | 8/2003 | Chang et al. | |
| 6,724,389 B1 | 4/2004 | Wilen et al. | |
| 6,731,514 B2 | 5/2004 | Evans | |
| 6,812,409 B2 | 11/2004 | Chen et al. | |
| 7,710,741 B1 | 5/2010 | Kelleher et al. | |
| 7,797,824 B2 | 9/2010 | Su | |
| 2012/0160555 A1* | 6/2012 | Thumser et al. | 174/262 |

* cited by examiner

*Primary Examiner* — Jenny L Wagner
*Assistant Examiner* — Michael P McFadden
(74) *Attorney, Agent, or Firm* — Zilka-Kotab, PC (57) ABSTRACT

Disclosed are a method and system to reduce impedance of printed circuit boards through an interconnecting of printed circuit boards using a square wave pattern of plated-through holes. A method of connecting a first printed circuit board to a second printed circuit board comprises forming a square wave pattern of the first printed circuit board and the second printed circuit board and adjoining the first printed circuit board and the second printed circuit board. The method also involves producing plated-through holes along the square wave pattern, a top section, and/or a bottom section of the adjoined first printed circuit board and second printed circuit board. The method further involves securing the top section and the bottom section using a first metal clip and a second metal clip, respectively, and connecting the first printed circuit board to the second printed circuit board by a wave soldering process.

20 Claims, 8 Drawing Sheets

REDUCING IMPEDANCE OF A PRINTED CIRCUIT BOARD THROUGH A SQUARE WAVE PATTERN OF PLATED-THROUGH HOLES

FIELD OF TECHNOLOGY

This disclosure relates generally to printed circuit boards, and more particularly, to a method to reduce impedance of a printed circuit board through a square wave pattern of plated-through holes.

BACKGROUND

A connection (direct or indirect) between a printed circuit board and another printed circuit board (PCB) may be necessary in order to connect circuit traces of one PCB to corresponding circuit traces of the other PCB. Indirect connections may require the utilization of connectors as intermediaries between the two PCBs to electrically connect the circuit traces. Direct connections may employ solder joints between the two PCBs, wherein the two boards are soldered together between the linking circuit traces. In particular, the boards may be connected through a soldering process called hot bar solder reflow process, which creates solder joints between the two PCBs.

Use of indirect connections for PCBs that are rigid (e.g. PCBs having a substrate made of FR-4 woven glass and epoxy laminate) may not be ideal in certain situations as the connectors may restrict the placement of electrical components on the connected PCBs. Furthermore, the solder joints of directly connected PCBs may lead to compromised mechanical stability of the boards. Specifically, the boards may have low flexular and/or shear strength.

In addition, indirect and direct connections may limit the length of the connected edges of the printed circuit boards. These limited edges and the solder joints formed specifically in direct connections may give rise to issues in the facilitation of the flow of current across the two printed circuit boards. As a result, impedance may not be optimized and/or resistance may not be reduced when possible.

SUMMARY

Disclosed are a method and system to reduce impedance of printed circuit boards by interconnecting printed circuit boards using a square wave pattern of plated-through holes.

In one aspect, a method of connecting a first printed circuit board to a second printed circuit board comprises forming a square wave pattern of an edge of the first printed circuit board and forming a complementary square wave pattern of a corresponding edge of the second printed circuit board; adjoining the first printed circuit board and the second printed circuit board, such that the square wave pattern of the edge of the first printed circuit board complements the square wave pattern of the corresponding edge of the second printed circuit board; and producing plated-through holes along the square wave pattern of the adjoined first printed circuit board and second printed circuit board and along a top section and a bottom section of the adjoined first printed circuit board and second printed circuit board. The plated-through holes may be produced along the square wave pattern of the adjoined first printed circuit board and second printed circuit board in such a way that for each plated-through hole, a first half of a plated-through hole may lie on the edge of the first printed circuit board and a second half of the plated-through hole may lie on the corresponding edge of the second printed circuit board. Furthermore, the plated-through holes may decrease an impedance of the printed circuit board.

The method further includes securing a top section of the adjoined first printed circuit board and second printed circuit board using a first metal clip and securing a bottom section of the adjoined first printed circuit board and second printed circuit board using a second metal clip. The first metal clip and/or the second metal clip may be a copper U-shaped clip comprising of a top side having concavities and a bottom side having comb-like projections. The method may further include connecting the first printed circuit board to the second printed circuit board to form a connected first printed circuit board and second printed circuit board by soldering along the square wave pattern using a wave soldering process. The connected first printed circuit board and second printed circuit board may be integrated into a graphics card. In addition, the method may include affixing the first metal clip and/or the second metal clip to the connected first printed circuit board and second printed circuit board by the wave soldering process.

In another aspect, a connected first printed circuit board and second printed circuit board comprises a first printed circuit board comprising a square wave pattern along an edge of the first printed circuit board; a second printed circuit board comprising a square wave pattern along a corresponding edge of the second printed circuit board; a first metal clip securing a top section of the connected first printed circuit board and second printed circuit board; a second metal clip securing a bottom section of the connected first printed circuit board and second printed circuit board; and plated-through holes along the square wave pattern, the top section, and the bottom section of the connected first printed circuit board and second printed circuit board.

The plated-through holes may be produced along the square wave pattern of the adjoined first printed circuit board and second printed circuit board in such a way that for each plated-through hole, a first half of a plated-through hole may lie on the edge of the first printed circuit board and a second half of the plated-through hole may lie on the corresponding edge of the second printed circuit board. Furthermore, the plated-through holes may decrease an impedance of the first printed circuit board and/or the second printed circuit board. The first metal clip and/or the second metal clip may be a copper U-shaped clip comprising of a top side having concavities and a bottom side having comb-like projections. Furthermore, the connected first printed circuit board and second printed circuit board may be integrated into a graphics card.

In yet another aspect, a method for decreasing impedance of a printed circuit board comprises forming a square wave pattern of an edge of the first printed circuit board and forming a complementary square wave pattern of a corresponding edge of the second printed circuit board; adjoining the first printed circuit board and the second printed circuit board, such that the square wave pattern of the edge of the first printed circuit board complements the square wave pattern of the corresponding edge of the second printed circuit board; and producing plated-through holes along the square wave pattern of the adjoined first printed circuit board and second printed circuit board and along a top section and a bottom section of the adjoined first printed circuit board and second printed circuit board. The plated-through holes may be produced along the square wave pattern of the adjoined first printed circuit board and second printed circuit board in such a way that for each plated-through hole, a first half of a plated-through hole may lie on the edge of the first printed circuit board and a second half of the plated-through hole may lie on the corresponding edge of the second printed circuit board.

The method further includes securing a top section of the adjoined first printed circuit board and second printed circuit board using a first metal clip and securing a bottom section of the adjoined first printed circuit board and second printed circuit board using a second metal clip. The first metal clip and/or the second metal clip may be a copper, U-shaped clip comprising of a top side having concavities and a bottom side having comb-like projections. The method may further include connecting the first printed circuit board to the second printed circuit board to form a connected first printed circuit board and second printed circuit board by soldering along the square wave pattern using a wave soldering process. The first metal clip and/or the second metal clip may be affixed to the connected first printed circuit board and second printed circuit board by the wave soldering process. The connected first printed circuit board and second printed circuit board may be integrated into a graphics card.

The methods, system, and/or apparatuses disclosed herein may be implemented in any means for achieving various aspects. Other features will be apparent from the accompanying drawing and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a method and system to reduce impedance of printed circuit boards by interconnecting printed circuit boards using a square wave pattern of plated-through holes.

Figure 1:
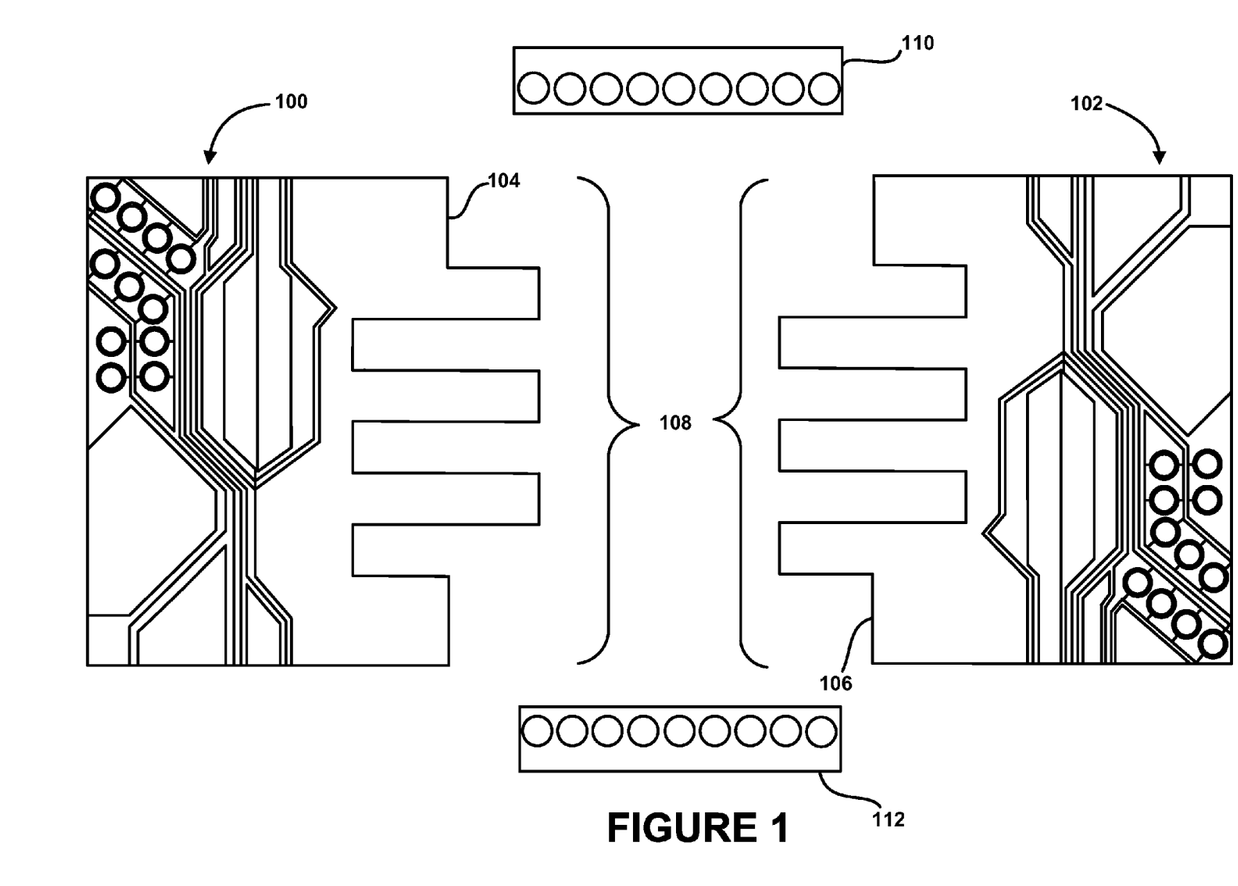
FIG. 1 depicts a first printed circuit board, a second printed circuit board, a square wave pattern along an edge of the first printed circuit board, and a square wave pattern along a corresponding edge of the second printed circuit board, according to one embodiment.

FIG. 1 depicts a first printed circuit board 100, a second printed circuit board 102, and a square wave pattern 108 along an edge 104 of the first printed circuit board 100 and a corresponding edge 106 of the second printed circuit board 102. The first printed circuit board 100 and/or the second printed circuit board 102 may be a rigid board comprised of a substrate having polytetrafluoroethylene, FR-4, FR-1, CEM-1, CEM-3, and/or other dielectric materials. The first printed circuit board 100 and/or the second printed circuit board 102 may include electrical components attached to a top surface of the first printed circuit board 100 and/or second printed circuit board 102. In one embodiment, a method involves forming a square wave pattern 108 of an edge 104 of a first printed circuit board 100 and forming a square wave pattern 108 of a corresponding edge 106 of a second printed circuit board 102. The square wave pattern 108 of the first printed circuit board 100 and the square wave pattern 108 of the second printed circuit board 102 is formed such that the square wave pattern 108 of the edge 104 of the first printed circuit board 100 complements the square wave pattern 108 of the corresponding edge 106 of the second printed circuit board 102.

Figure 3:
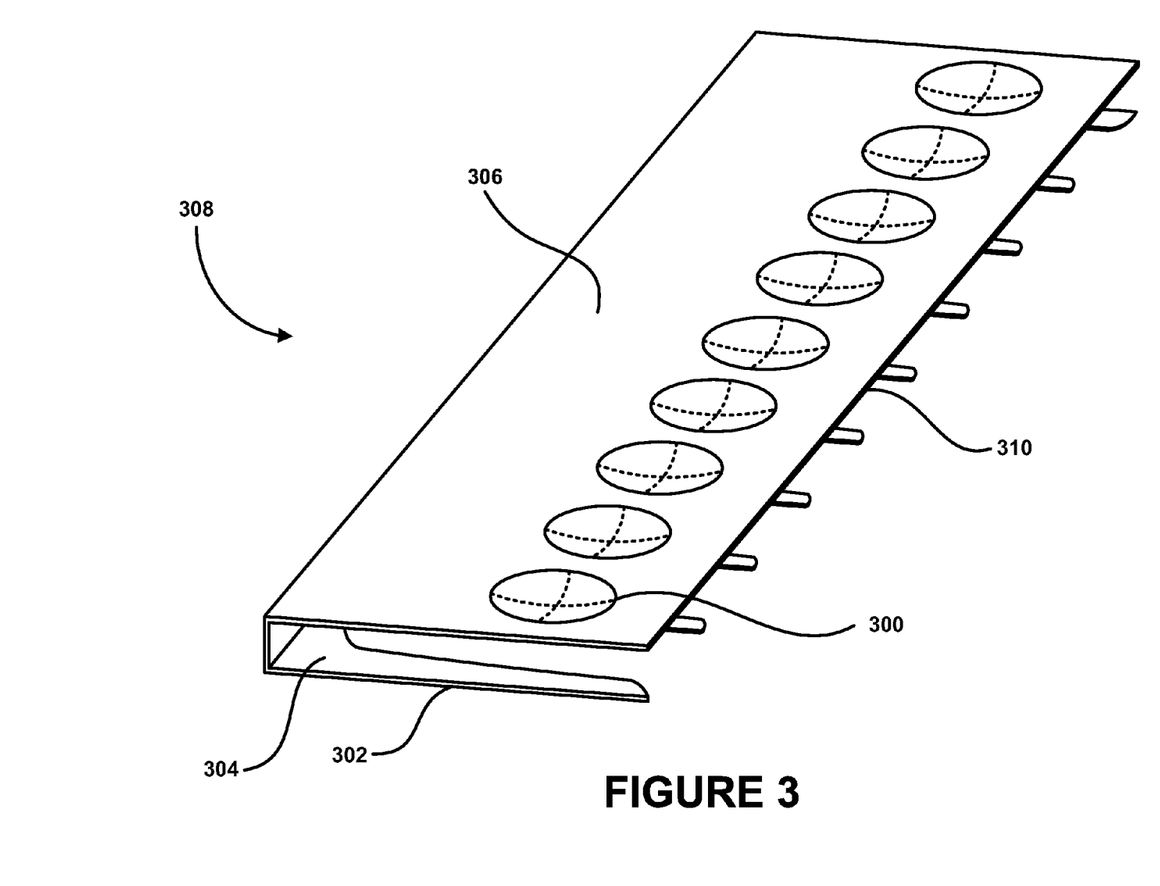
FIG. 3 is a top isometric view of the first metal clip of FIG. 2B, depicting the first metal clip as U-shaped with a bottom side, a top side, concavities, and comb-like projections, according to one embodiment.
Figure 4:
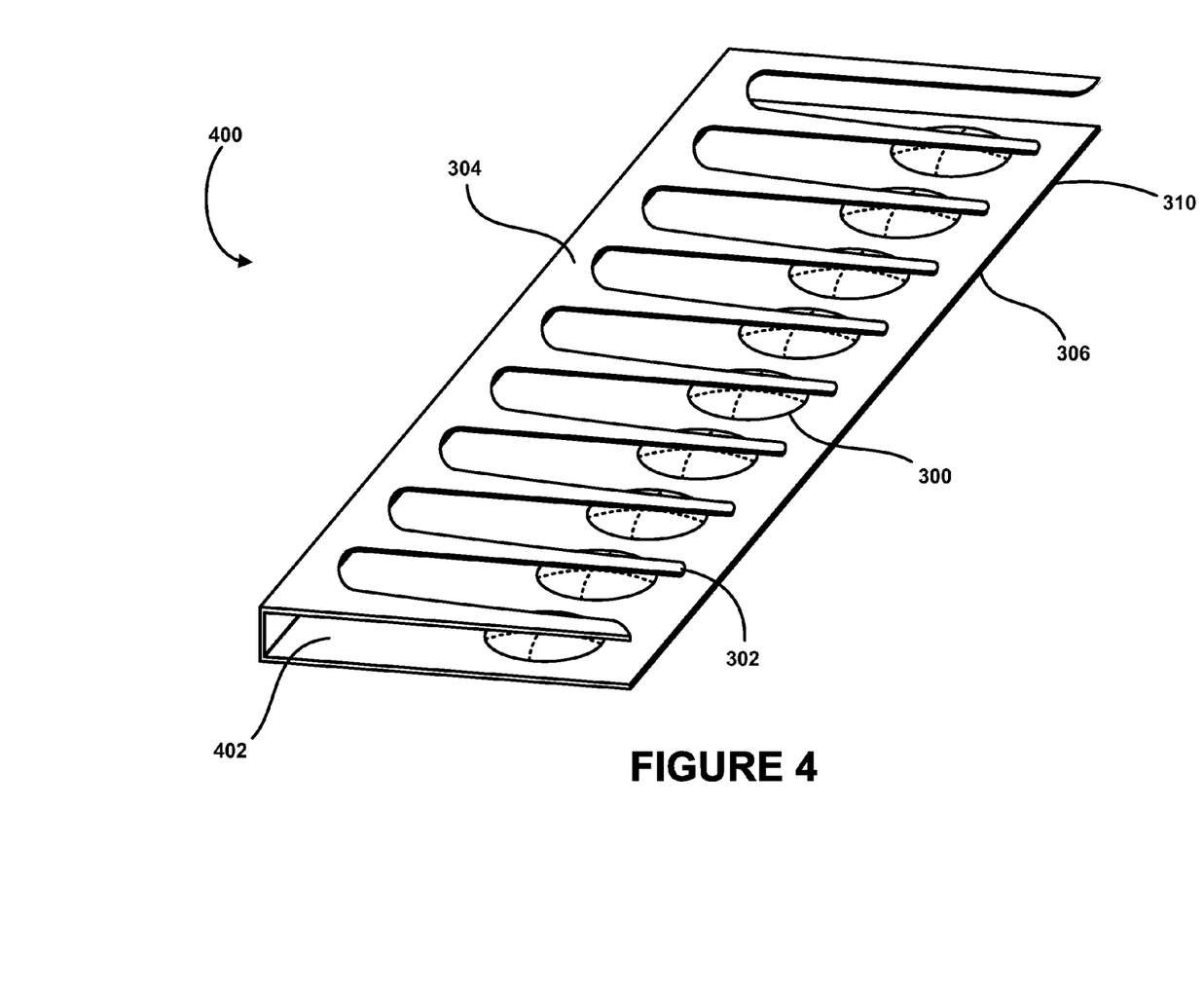
FIG. 4 is a bottom isometric view of the first metal clip of FIG. 3, showing a bottom side, a top side, concavities, and comb-like projections, according to one embodiment.

FIG. 1 further depicts a first metal clip 110 and a second metal clip 112. As shown in the top isometric view 308 of FIG. 3, the first metal clip 110 and/or the second metal clip 112 may be U-shaped and may comprise of a top side 306 having concavities 300 and a bottom side 304 having comb-like projections 302. FIG. 4 is a bottom isometric view 400, showing a bottom side 304, an underside 402, a top side 306, concavities 300, and comb-like projections 302 of the first metal clip 110 and/or the second metal clip 112. The concavities 300 of the first metal clip 110 and/or the second metal clip 112 may be aligned adjacent to the top edge 310 of the top side 306. More particularly, the concavities 300 may be depressions in the top side 306 of the first metal clip 110 and/or the second metal clip 112. In addition, the concavities 300 may protuberate from the underside 402 of the top side 306 of the first metal clip 110 and/or the second metal clip 112. Furthermore, the first metal clip 110 and/or the second metal clip 112 may be made of copper.

The method further involves adjoining the first printed circuit board 100 and the second printed circuit board 102. This may involve placing the first printed circuit board 100 in a position such that the edge 104 of the first printed circuit board 100 is tangential to the corresponding edge 106 of the second printed circuit board 102. The square wave pattern 108 of the first printed circuit board 100 may complement the square wave pattern 108 of the second printed circuit board 102, as depicted in FIG. 2A.

Figure 2A:
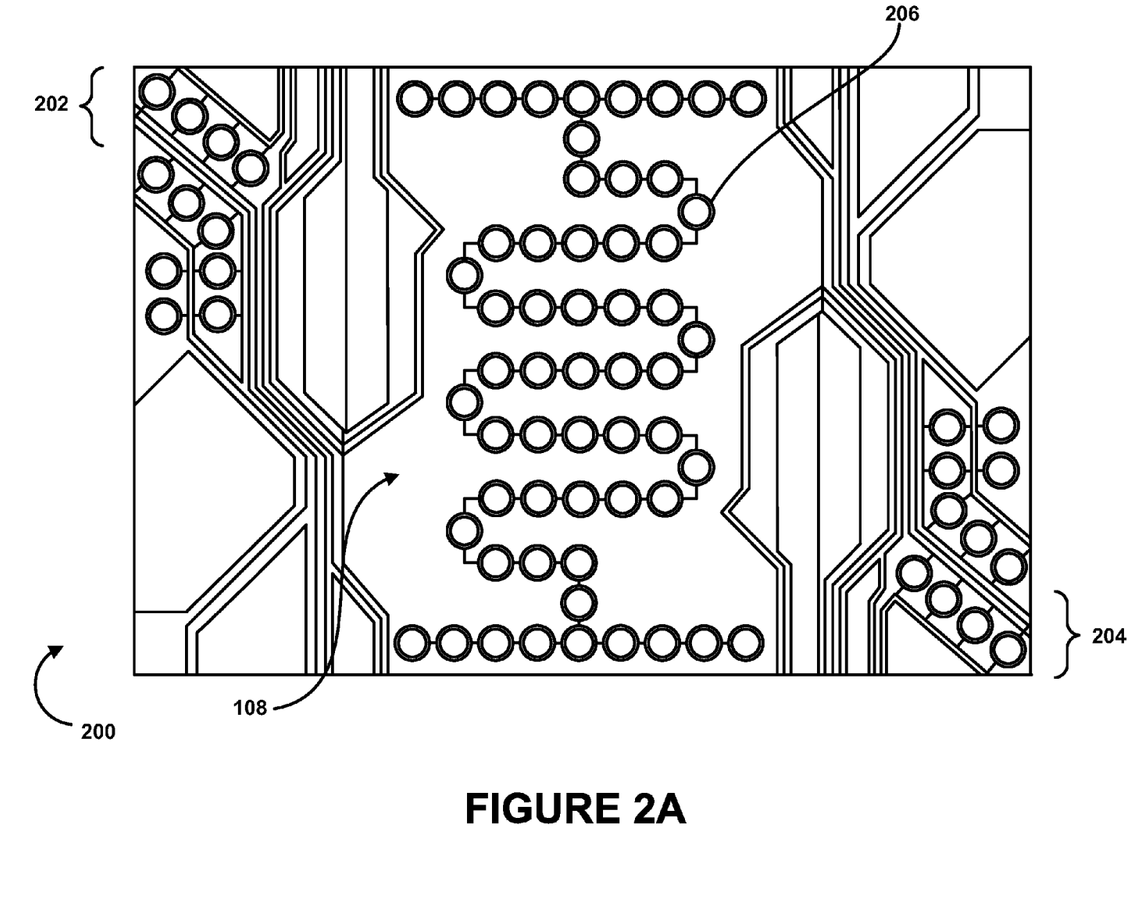
FIG. 2A is an illustration of an adjoined first printed circuit board and second printed circuit board with plated-through holes arranged in a square wave pattern and along a top section and a bottom section of the adjoined first printed circuit board and second printed circuit board, according to one embodiment.

Specifically, FIG. 2A is an illustration of an adjoined first printed circuit board and second printed circuit board 200 with plated-through holes 206 arranged in a square wave pattern 108, according to one embodiment. The adjoined first printed circuit board and second printed circuit board 200 comprises a top section 202 and a bottom section 204. In one embodiment, a method involves producing plated-through holes 206 along the square wave pattern 108 of the adjoined first printed circuit board and second printed circuit board 200 and along the top section 202 and the bottom section 204 of the adjoined first printed circuit board and second printed circuit board 200. The plated-through holes 206 may be produced such that for each plated-through hole 206, a first half of a plated-through hole 206 lies on the edge 104 of the first printed circuit board 100 and a second half of the plated-through hole 206 lies on the corresponding edge 106 of the second printed circuit board 102.

In particular, the plated-through holes 206 may be produced by an initial drilling of holes along the square wave pattern 108, the top section 202, and/or the bottom section 204 of the adjoined first printed circuit board and second printed circuit board 200. The drilling of holes may be accomplished with small-diameter drill bits comprised of solid tungsten carbide. Subsequent to the drilling of the holes, the inner walls of the holes may be electroplated with copper and/or tin to form the plated-through holes 206. Furthermore, the inner walls of the holes may be made conductive prior to the electroplating.

Figure 2B:
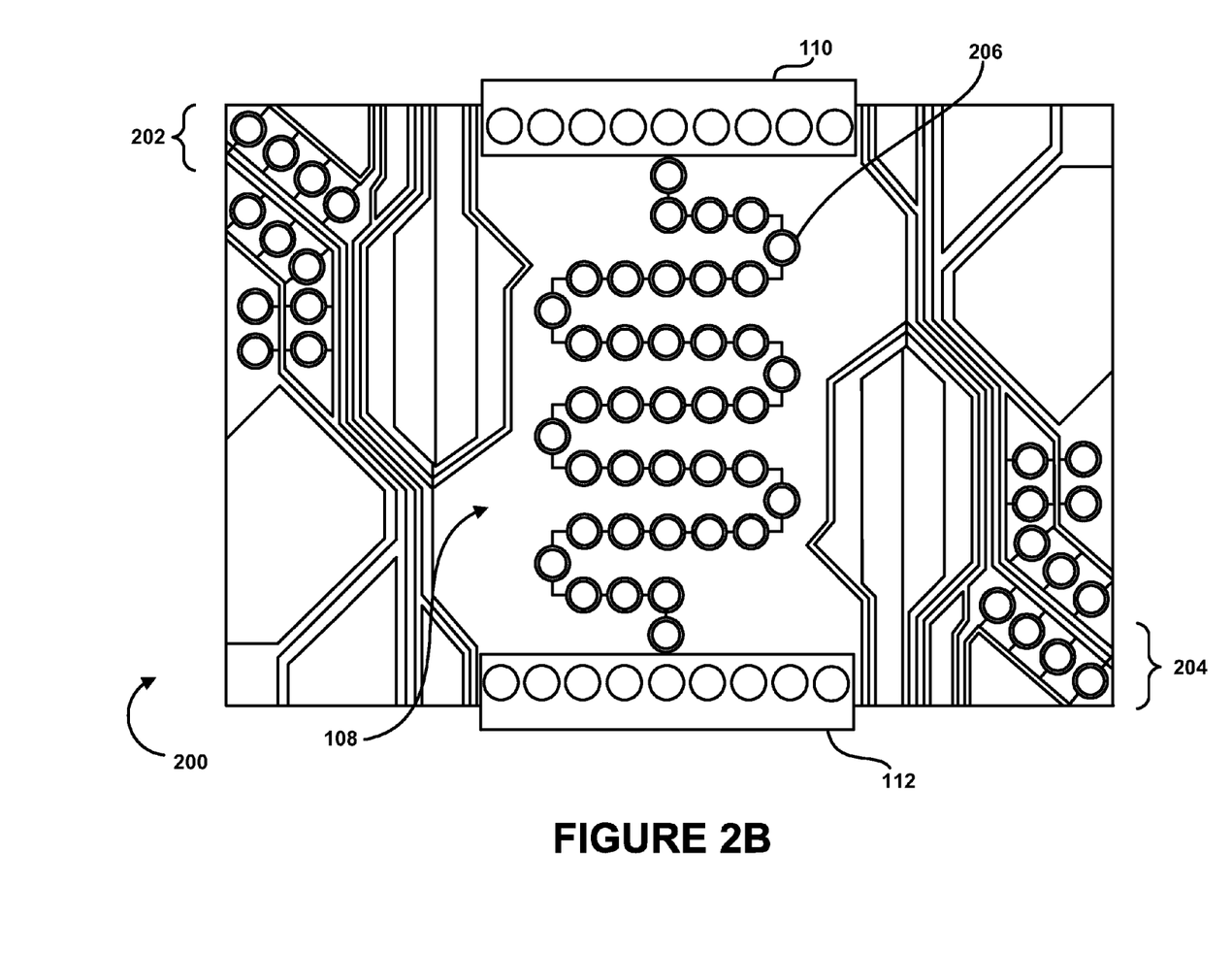
FIG. 2B depicts the adjoined first printed circuit board and second printed circuit board of FIG. 2A and a first metal clip and a second metal clip secured to the top section and the bottom section of the adjoined first printed circuit board and second printed circuit board, according to one embodiment.

Furthermore, the method involves securing the top section 202 of the adjoined first printed circuit board and second printed circuit board 200 using the first metal clip 110 and securing the bottom section 204 of the adjoined first printed circuit board and second printed circuit board 200 using the second metal clip 112. FIG. 2B demonstrates the first metal clip 110 secured to the top section 202 of the adjoined first printed circuit board and second printed circuit board 200 and the second metal clip 112 secured to the bottom section 204 of the adjoined first printed circuit board and second printed circuit board 200.

Specifically, the first metal clip 110 and/or the second metal clip 112 may be placed such that the concavities 300 of the first metal clip 110 and/or the second metal clip 112 rest within the plated-through holes 206. In addition, placement of the first metal clip 110 and/or the second metal clip 112 may be such that the comb-like projections 302 lie between the plated-through holes 206 of the adjoined first printed circuit board and second printed circuit board 200.

Figure 5:
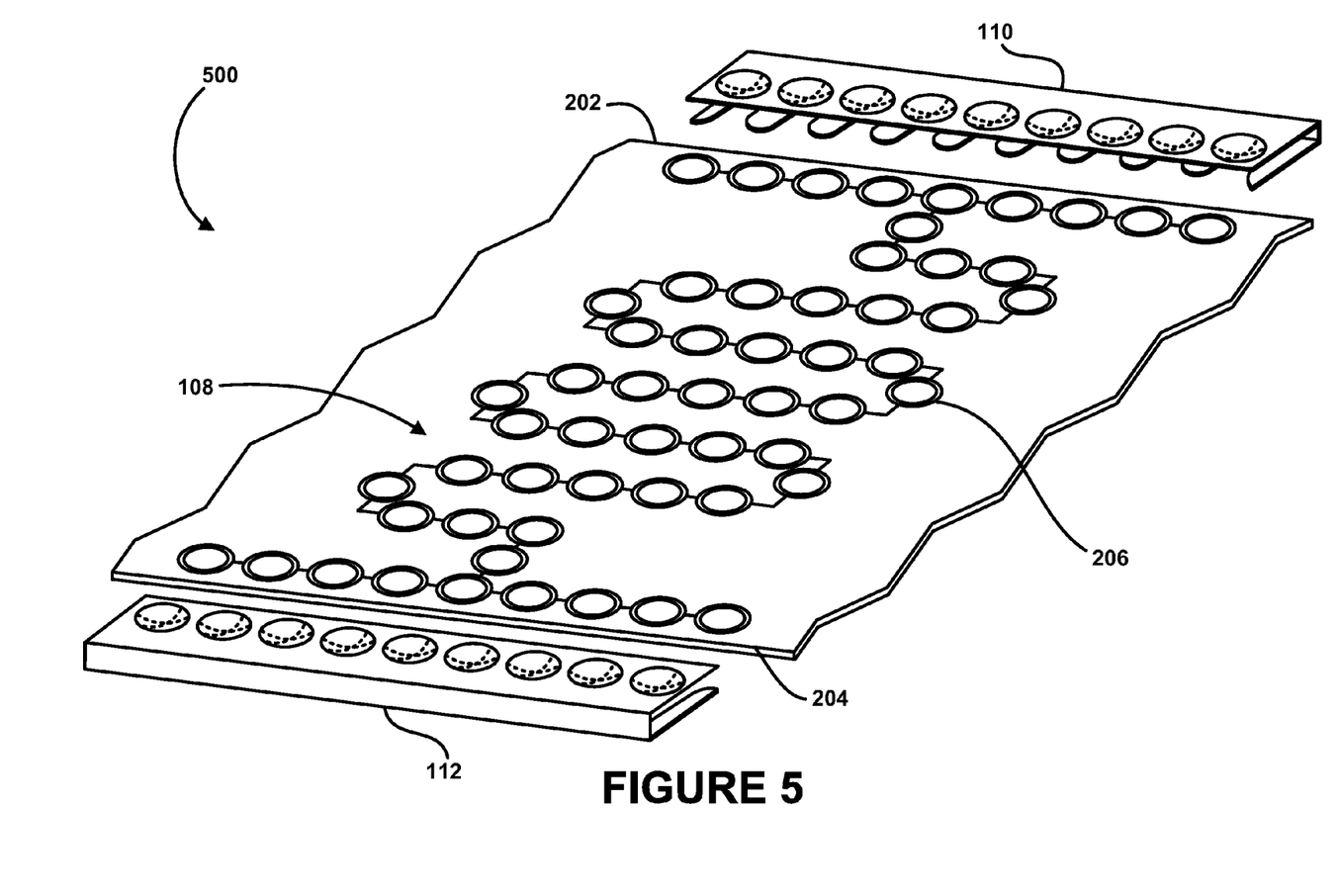
FIG. 5 is an isometric view of a portion of a connected first printed circuit board and second printed circuit board, demonstrating a placement of a first metal clip and a second metal clip when being secured to the adjoined first printed circuit board and second printed circuit board of FIG. 2A, according to one embodiment.

FIG. 5 is an isometric view 500 of a portion of the adjoined first printed circuit board and second printed circuit board 200, demonstrating a placement of the first metal clip 110 and the second metal clip 112 when being secured to the adjoined first printed circuit board and second printed circuit board 200.

In particular, the first metal clip 110 may be secured to the top section 202 of the adjoined first printed circuit board and second printed circuit board 200 by resting the concavities 300 of the top side 306 of the first metal clip 110 within the plated-through holes 206 of the top section 202 of the adjoined first printed circuit board and second printed circuit board 200. Similarly, the second metal clip 112 may be secured to the bottom section 204 of the adjoined first printed circuit board and second printed circuit board 200 by resting the concavities 300 of the bottom section 204 of the adjoined first printed circuit board and second printed circuit board 200 within the plated-through holes 206 of the bottom section 204 of the adjoined first printed circuit board and second printed circuit board 200.

The method further involves connecting the first printed circuit board 100 to the second printed circuit board 102 to form the connected first printed circuit board and second printed circuit board by soldering along the square wave pattern 108 using a wave soldering process. The connected first printed circuit board and second printed circuit board may appear as the adjoined first printed circuit board and second printed circuit board 200 of FIG. 2B and may be integrated into a graphics card of a computing system. A bottom surface of the adjoined first printed circuit board and second printed circuit board 200 may be soldered to form the connected first printed circuit board and second printed circuit board. Specifically, the wave soldering process may involve the use of waves of molten solder. The exact process of wave soldering a printed circuit board should be understood by one of ordinary skill in the art and will not be described in further detail in this disclosure.

Furthermore, the plated-through holes 206 of the connected first printed circuit board and second printed circuit may decrease an impedance of the connected first printed circuit board and second printed circuit board. For example, the impedance of a printed circuit board with plated-through holes along a straight edge may be 50 milliohms, whereas the impedance of a printed circuit board with plated-through holes along an edge in a square wave pattern may be 0.5 milliohms. In particular, the impedance of the printed circuit board may be reduced due to the increased number of plated-through holes that may be placed along an edge in a square wave pattern when compared to the number of plated-through holes that may be aligned along a straight edge.

The method may also involve affixing the first metal clip 110 and the second metal clip 112 to the connected first printed circuit board and second printed circuit board by the wave soldering process used to form the connected first printed circuit board and second printed circuit board. The first metal clip 110 and the second metal clip 112 may be affixed, by a wave soldering process, to the connected first printed circuit board and second printed circuit board such that the comb-like projections 302 lie between the plated-through holes 206 along the top section 202 and the bottom section 204, respectively, of the connected first printed circuit board and second printed circuit board. Additionally, the voids created by the comb-like projections 302 may expose the plated-through holes 206 for the wave soldering process.

Figure 6:
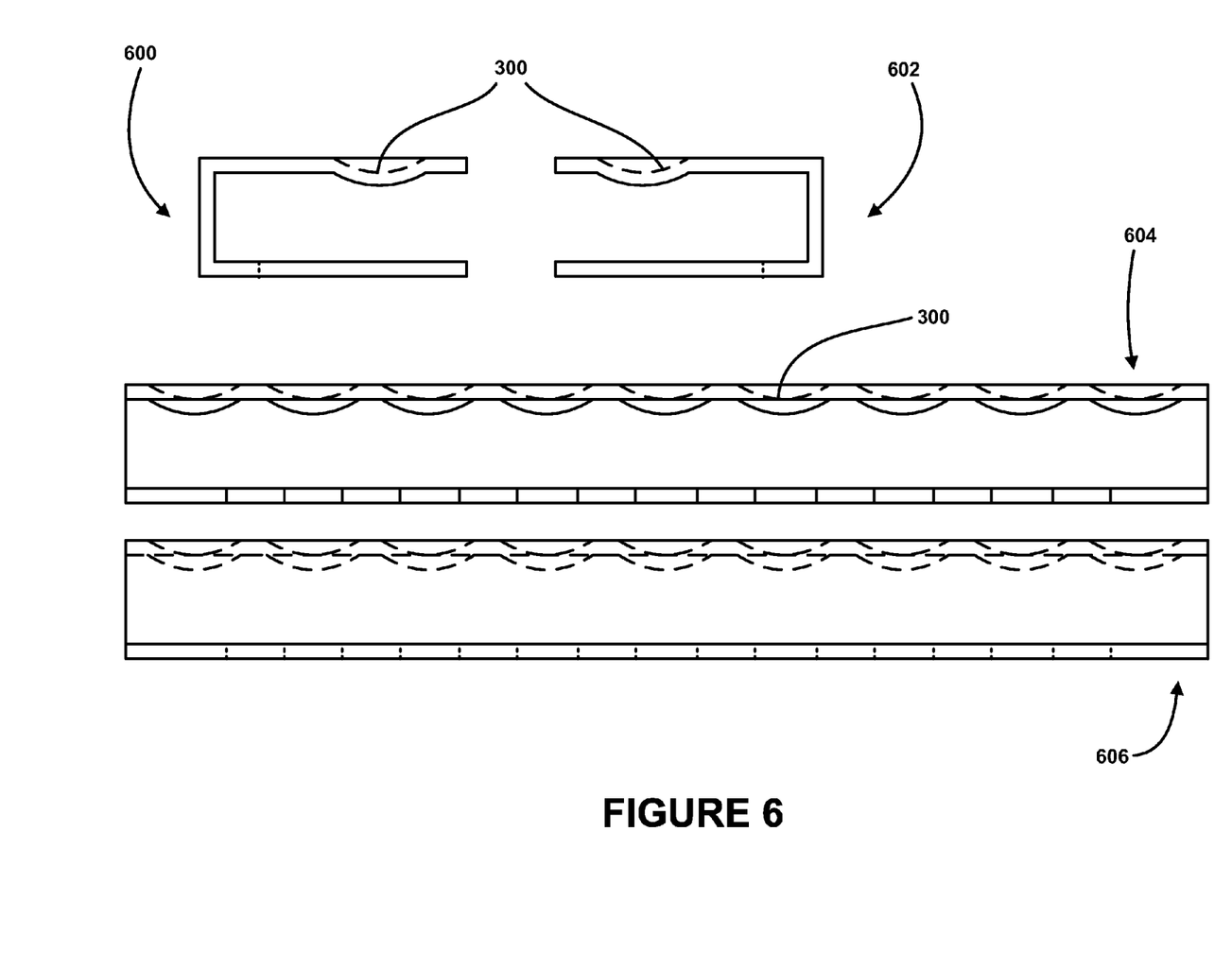
FIG. 6 depicts multiple cross-sectional views of the metal clip, specifically a right cross-sectional view, a left cross-sectional view, a front cross-sectional view, and a back cross-sectional view, according to one embodiment.

FIG. 6 depicts multiple cross-sectional views of the first metal clip 110 and/or the second metal clip 112. A right cross-sectional view 600 portrays a right side of the first metal clip 110 and/or the second metal clip 112. The concavities 300 of the top side 306 of the first metal clip 110 and/or the second metal clip 112 is apparent in the right cross-sectional view 600. A left cross-sectional view 602 depicts a left side of the first metal clip 110 and/or the second metal clip 112. The concavities 300 of the top side 306 of the first metal clip 110 and/or the second metal clip 112 is illustrated. FIG. 6 further depicts a front cross-sectional view 604 and a back cross-sectional view 606 of the first metal clip 110 and/or second metal clip 112. Concavities 300 of the top side 306 of the first metal clip 110 and/or the second metal clip 112 are also depicted.

Figure 7:
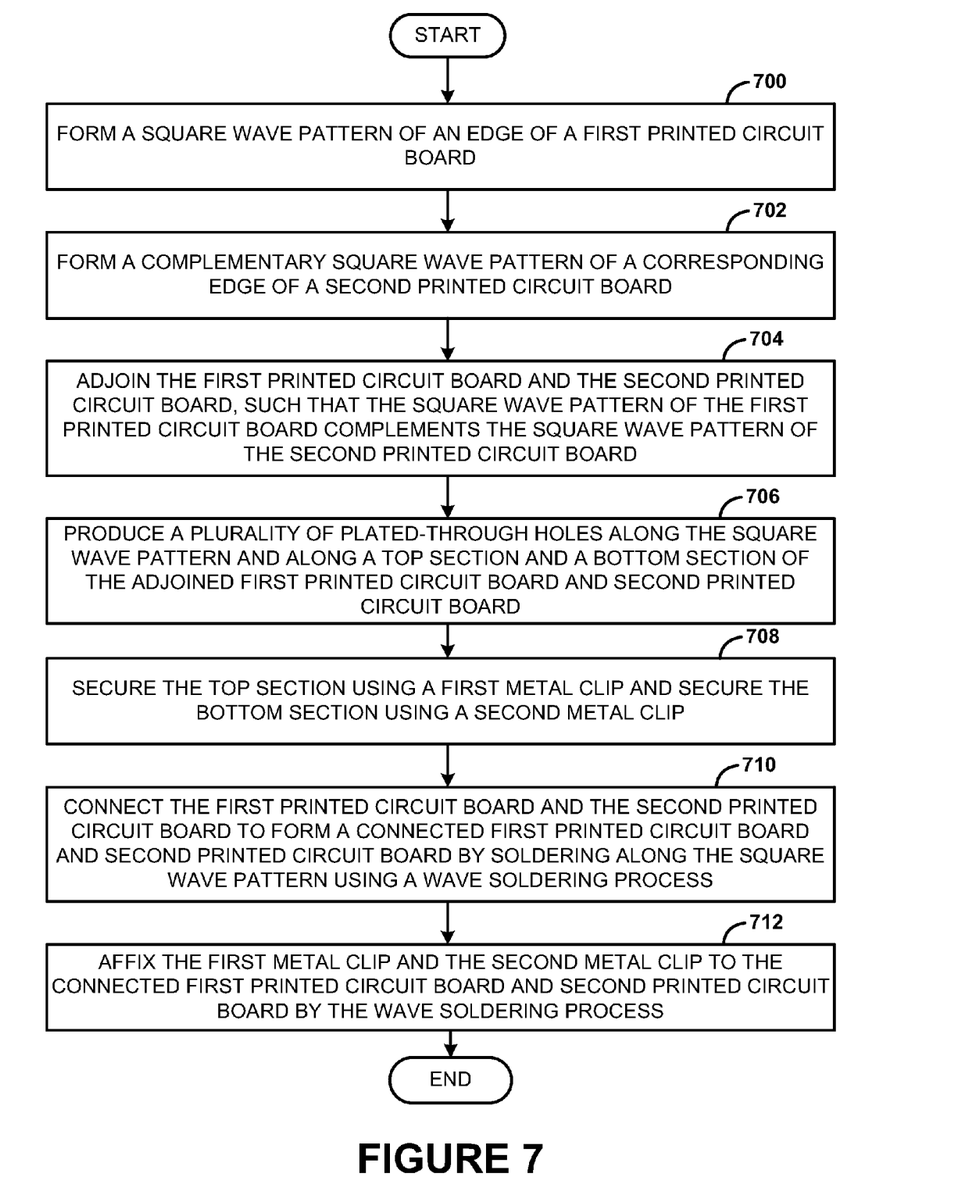
FIG. 7 is a process flow diagram of connecting a first printed circuit board to a second printed circuit board, according to one embodiment.

FIG. 7 is a process flow diagram demonstrating the steps of connecting a first printed circuit board 100 to a second printed circuit board 102, according to one embodiment. In operation 700, a square wave pattern 108 may be formed on an edge 104 of a first printed circuit board 100. A complementary square wave pattern 108 may be formed on a corresponding edge 106 of a second printed circuit board 102, as illustrated in operation 702. In addition, operation 704 may involve adjoining the first printed circuit board 100 and the second printed circuit board 102, such that the square wave pattern 108 of the first printed circuit board 100 complements the square wave pattern 108 of the second printed circuit board 102. Operation 706 may involve producing plated-through holes 206 along the square wave pattern 108 and along a top section 202 and a bottom section 204 of the adjoined first printed circuit board and second printed circuit board 200.

Furthermore, operation 708 may involve securing the top section 202 of the adjoined first printed circuit board and second printed circuit board 200 using a first metal clip 110 and securing the bottom section 204 of the adjoined first printed circuit board and second printed circuit board 200 using a second metal clip 112. As outlined in operation 710, the first printed circuit board 100 and the second printed circuit board 102 may then be connected by soldering along the square wave pattern 108 using a wave soldering process to form a connected first printed circuit board and second printed circuit board. Furthermore, operation 712 may involve affixing the first metal clip 110 and the second metal clip 112 to the connected first printed circuit board and second printed circuit board by the wave soldering process.

Although the present embodiments have been described with reference to specific example embodiments, it will be evident that various modifications and changes may be made to these embodiments without departing from the broader spirit and scope of the various embodiments. For example, the first printed circuit board and the second printed circuit board may be created by cutting a printed circuit board in a square wave pattern along its center. The two resulting pieces of printed circuit board may be the first printed circuit board and the second printed circuit board. Furthermore, the holes drilled to create the plated-through holes may be drilled prior or subsequent to the cutting of the printed circuit board in a square wave pattern.

What is claimed is:

1. A method of connecting a first printed circuit board to a second printed circuit board, comprising:
   forming a square wave pattern of an edge of the first printed circuit board and forming a complementary square wave pattern of a corresponding edge of the second printed circuit board;
   adjoining the first printed circuit board and the second printed circuit board, such that the square wave pattern of the edge of the first printed circuit board complements the square wave pattern of the corresponding edge of the second printed circuit board;
   producing a plurality of plated-through holes along the square wave pattern of the adjoined first printed circuit board and second printed circuit board and along a top section and a bottom section of the adjoined first printed circuit board and second printed circuit board;
   securing the top section of the adjoined first printed circuit board and second printed circuit board using a first metal clip and securing the bottom section of the adjoined first printed circuit board and second printed circuit board using a second metal clip; and
   connecting the first printed circuit board to the second printed circuit board to form a connected first printed circuit board and second printed circuit board by soldering along the square wave pattern using a wave soldering process.

2. The method of claim 1, wherein the plurality of plated-through holes are produced along the square wave pattern of the adjoined first printed circuit board and second printed circuit board, such that for each plated-through hole, a first half of a plated-through hole lies on the edge of the first printed circuit board and a second half of the plated-through hole lies on the corresponding edge of the second printed circuit board.

3. The method of claim 1, wherein at least one of the first metal clip and the second metal clip is a U-shaped clip comprising of a top side having a plurality of concavities and a bottom side having comb-like projections.

4. The method of claim 1, further comprising:
   affixing the first metal clip and the second metal clip to the connected first printed circuit board and second printed circuit by the wave soldering process.

5. The method of claim 1, wherein at least one of the first metal clip and the second metal clip is made of copper.

6. The method of claim 1, wherein the plurality of plated-through holes decreases an impedance of the connected first printed circuit board and the second printed circuit board.

7. The method of claim 1, wherein the connected first printed circuit board and second printed circuit board is configured to be integrated into a graphics card.

8. A connected first printed circuit board and second printed circuit board comprising:
   a first printed circuit board comprising a square wave pattern along an edge of the first printed circuit board;
   a second printed circuit board comprising a square wave pattern along a corresponding edge of the second printed circuit board;
   a plurality of plated-through holes along the square wave pattern, a top section, and a bottom section of the connected first printed circuit board and second printed circuit board;
   a first metal clip securing the top section of the connected first printed circuit board and second printed circuit board; and
   a second metal clip securing the bottom section of the connected first printed circuit board and second printed circuit board.

9. The connected first printed circuit board and second printed circuit board of claim 8, wherein the plurality of plated-through holes are produced along the square wave pattern of the connected first printed circuit board and second printed circuit board, such that for each plated-through hole, a first half of a plated-through hole lies on the edge of the first printed circuit board and a second half of the plated-through hole lies on the corresponding edge of the second printed circuit board.

10. The connected first printed circuit board and second printed circuit board of claim 8, wherein at least one of the first metal clip and the second metal clip is a U-shaped clip comprising of a top side having a plurality of concavities and a bottom side having comb-like projections.

11. The connected first printed circuit board and second printed circuit board of claim 8, wherein the plurality of plated-through holes decrease an impedance of the first printed circuit board and the second printed circuit board.

12. The connected first printed circuit board and second printed circuit board of claim 8, wherein at least one of the first metal clip and the second metal clip is made of copper.

13. The connected first printed circuit board and second printed circuit board of claim 8, wherein the connected first printed circuit board and second printed circuit board is configured to be integrated into a graphics card.

14. A method for decreasing an impedance of a printed circuit board, comprising:
   forming a square wave pattern of an edge of the first printed circuit board and forming a complementary square wave pattern of a corresponding edge of the second printed circuit board;
   adjoining the first printed circuit board and the second printed circuit board, such that the square wave pattern of the edge of the first printed circuit board complements the square wave pattern of the corresponding edge of the second printed circuit board;
   producing a plurality of plated-through holes along the square wave pattern of the adjoined first printed circuit board and second printed circuit board and along a top section and a bottom section of the adjoined first printed circuit board and second printed circuit board;

securing the top section of the adjoined first printed circuit board and second printed circuit board using a first metal clip and securing the bottom section of the adjoined first printed circuit board and second printed circuit board using a second metal clip; and connecting the first printed circuit board to the second printed circuit board to form a connected first printed circuit board and second printed circuit board by soldering along the square wave pattern using a wave soldering process.

15. The method of claim 14, wherein the plurality of plated-through holes are produced along the square wave pattern of the connected first printed circuit board and second printed circuit board, such that for each plated-through hole, a first half of a plated-through hole lies on the edge of the first printed circuit board and a second half of the plated-through hole lies on the corresponding edge of the second printed circuit board.

16. The method of claim 14, wherein at least one of the first metal clip and the second metal clip is a U-shaped clip comprising of a top side having a plurality of concavities and a bottom side having comb-like projections.

17. The method of claim 14, wherein at least one of the first metal clip and the second metal clip is made of copper.

18. The method of claim 14, wherein the first metal clip and the second metal clip are affixed to the top section and the bottom section, respectively, of the connected first printed circuit board and second printed circuit board by a wave soldering process.

19. The method of claim 14, wherein the connected first printed circuit board and second printed circuit board is configured to be integrated into a graphics card.

20. The method of claim 14, wherein the impedance is reduced by the plurality of plated-through holes along the square wave pattern of the connected first printed circuit board and second printed circuit board.

* * * * *